United States Patent [19]

Ohnuma et al.

[11] Patent Number: 5,153,073
[45] Date of Patent: Oct. 6, 1992

[54] ELECTROLUMINESCENT DEVICE

[75] Inventors: Teruyuki Ohnuma; Tomoyuki Shimada, both of Shizuoka; Masafumi Ohta, Susono; Fumio Kawamura, Shizuoka; Yohta Sakon; Toshihiko Takahashi, both of Numazu, all of Japan

[73] Assignee: Ricoh Company, Ltd., Tokyo, Japan

[21] Appl. No.: 723,375

[22] Filed: Jun. 28, 1991

[30] Foreign Application Priority Data

Jul. 6, 1990 [JP] Japan .................................. 2-179355
Nov. 10, 1990 [JP] Japan .................................. 2-305405

[51] Int. Cl.$^5$ ........................ B32B 15/04; H01J 1/62; H01L 29/12
[52] U.S. Cl. .................................. 428/461; 428/412; 428/441; 428/442; 428/463; 428/515; 428/917; 428/476.3; 313/504; 313/503; 313/506
[58] Field of Search ............... 428/515, 461, 917, 412, 428/463, 441, 476.3, 442; 313/504, 503, 506

[56] References Cited

U.S. PATENT DOCUMENTS

| | | | |
|---|---|---|---|
| 3,172,862 | 3/1965 | Gurnee et al. | 313/504 |
| 3,173,050 | 3/1965 | Gurnee | 313/504 |
| 4,720,432 | 1/1988 | VanSlyke | 428/461 |
| 4,769,292 | 9/1988 | Tang et al. | 428/917 |
| 5,047,687 | 9/1991 | VanSlyke et al. | 428/457 |

*Primary Examiner*—P. C. Sluby
*Attorney, Agent, or Firm*—Oblon, Spivak, McClelland, Maier & Neustadt

[57] ABSTRACT

Disclosed herein is an electroluminescent device comprising an anode and a cathode and one or plurality of organic compound layer sandwiched therebetween, at least one of the organic compound layers being composed of an organic compound represented by the general formula (I):

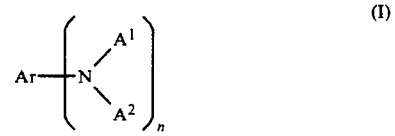

(wherein $A^1$ and $A^2$ each represents a substituted or unsubstituted alkyl group, or a substituted or unsubstituted aryl group which may be identical or different with each other, Ar represents a substituted or unsubstituted pyrenyl group and n represents 1 or 2).

8 Claims, 1 Drawing Sheet

ELECTROLUMINESCENT DEVICE

BACKGROUND OF THE INVENTION

The present invention relates to an electroluminescent device having a luminescent layer comprising a luminescence substance, capable of directly converting an electric energy into a light energy by application of an electric field and capable of providing a surface luminescence of a large area different from conventional incandescent lamps, fluorescent lamps or light emitting diodes.

The electroluminescent device can be classified, depending on the difference of the luminescence excitation mechanism into the following two groups: (1) an AC driving electroluminescent device of exciting a luminescent material by the local transfer of electrons or holes in a luminescent layer and emitting light only under an AC electric field, and (2) a DC deriving electroluminescent device of exciting a luminescent material by the injection of electrons and holes from electrodes and recombination of the electrons and holes in a luminescent layer, and operating under a DC electric field. The AC deriving electroluminescent device generally uses, as a luminescent material an inorganic compound comprising ZnS to which Mn or Cu is added, but it involves various problems such that it requires an AC electric field at a voltage of higher than 200 V for driving and expensive production cost, and it has an insufficient luminance or durability.

From since a thin film of an organic compound has been used as the luminescence layer, a DC deriving electroluminescent device showing high luminance is obtainable. For instance, Japanese Patent Application Laid-Open (KOKAI) 59 195393 (1984), U.S. Pat. No. 4,539,507, Japanese Patent Application Laid-Open (KOKAI) 63-295695 (1988), U.S. Pat. No. 4,720,432 and Japanese Patent Application Laid-Open (KOKAI) 63-264692 (1988) disclose electroluminescent devices comprising anode, organic hole transporting region, organic electron luminescent region and cathode. As typical examples of the materials used for the device, there can be exemplified an aromatic tertiary amine as the organic hole transporting material and aluminum trisoxine as the organic electron luminescent material.

Further, an electroluminescent device comprising an anode, an organic hole transporting layer, a luminescent layer, an organic electron transporting layer and a cathode is reported in JPn. Journal of Applied Physics. Vol. 27, P 713~715. As the material used for the device, there can be exemplified, for example, N,N'-diphenyl-N,N'-bis(3 methylphenyl)-1,1'-biphenyl-4,4'-diamine as the organic hole transporting material, 3,4,9,10-perylene tetracarboxylic acid bisbenzimidazole as the organic electron transporting material and phthaloperynone as the luminescent material.

These embodiments point out a necessity for studying various characteristics of such organic compounds and effectively combining the characteristics to provide an electroluminescent device in order to use organic compounds for the hole transporting material, luminescent material and electron transporting material. In other word, they show a necessity for the research and development of organic compounds over a wide range.

Further, the history for the studies of the DC deriving electroluminescent device using the organic compounds including the above-mentioned embodiments as the luminescent material is short and, accordingly, it can not be said that a sufficient studies have been made for the materials and for the formation of electroluminescent devices. At present, there are a lot of technical problems to be dissolved such as a further improvement of the luminance, diversification of emission wavelength in order to precisely select the luminescent hues of blue, green and red in view of an application to a full color display, and an improvement in the durability.

In view of the situations in the prior arts, it is an object of the present invention to provide an electroluminescent device having diversification in the emission wavelength, and exhibiting various luminescence hues and excellent in the durability.

As a result of the present inventors' earnest study on the constituent elements for the luminescent layer for resolving the foregoing technical problems, it has been found that the foregoing object can be attained by an electroluminescent device comprising an anode, a cathode and one or plurality of organic compound layer sandwiched therebetween, wherein at least one of the organic compound layers comprises a constituent element of an organic compound represented by the following general formula (I):

(wherein $A^1$ and $A^2$ each represents a substituted or unsubstituted alkyl group, or a substituted or unsubstituted aryl group which may be identical or different with each other, Ar represents a substituted or unsubstituted pyrenyl group and n represents 1 or 2). Based on this finding, the present invention has been attained.

SUMMARY OF THE INVENTION

In an aspect of the present invention, there is provided an electroluminescent device comprising an anode, a cathode and one or plurality of organic compound layers sandwiched therebetween, wherein at least one of the organic compound layers comprises a constituent element of an organic compound represented by the general formula (I):

(wherein $A^1$ and $A^2$ each represents a substituted or unsubstituted alkyl group, or a substituted or unsubstituted aryl group, which may be identical or different with each other, Ar represents a substituted or unsubstituted pyrenyl group and n represents 1 or 2).

DETAILED DESCRIPTION OF THE INVENTION

In the organic compound represented by the general formula (I) according to the present invention, Ar represents a substituted or unsubstituted pyrenyl group (benzo[def]phenanthryl group); $A^1$ and $A^2$ each represents a substituted or unsubstituted alkyl group, or a substituted or unsubstituted aryl group.

As the alkyl group of $A^1$ and $A^2$, there can be mentioned a linear or branched alkyl group having 1 to 20 carbon atoms, preferably, 1 to 12 carbon atoms, and as the substituent therefor, there can be mentioned a hydroxy group, cyano group, $(C_1 \sim C_{10})$ alkoxy group, phenyl group, halogen atom, and a phenyl group substituted with $(C_1 \sim C_{12})$ alkyl group or $(C_1 \sim C_{12})$ alkoxy group.

As the aryl group of the $A^1$ and $A^2$, there can be mentioned a monocyclic aromatic group, polycarbocyclic aromatic group and heterocyclic aromatic group.

As the monocyclic aromatic group and the polycyclic aromatic group, there can be mentioned a phenyl group, tolyl group, xylyl group, biphenylyl group, terphenylyl group, naphthyl group, anthryl group and phenanthryl group, preferably, phenyl group, biphenylyl group, terphenylyl group and naphthyl group.

As the heterocyclic aromatic group, there can be mentioned, pyridyl group, pyrimidyl group, pyradinyl group, triazinyl group, furanyl group, pyrrolyl group, thiophenyl group, quinolyl group, cumarinyl group, benzofuranyl group, benzimidazolyl group, benzoxazolyl group, dibenzofuranyl group, benzothiophenyl group, dibenzothiophenyl group, indolyl group, carbazolyl group, pyrazolyl group, imidazolyl group, oxazolyl group, isooxazolyl group, thiazolyl group, indazolyl group, benzothiazolyl group, pyridazinyl group, cinnolyl group, quinazolyl group, quinoxalyl group, phthalazinyl group, phthalazine dionyl group, phthalamidyl group, chromonyl group, naphtholactamyl group, quinolonyl group, o-sulfobenzoic imidyl group, maleic imidyl group, naphthalydinyl group, benzimidazolonyl group, benzoxazolonyl group, benzothiazolonyl group, benzothiazothionyl, quiazolonyl group, quinoxalonyl group, phthalazonyl group, dioxopyrimidinyl group, pyridonyl group, isoquinolonyl group, isoquinolinyl group, isothiazolyl group, benzisoquixazolyl group, benzisothiazolyl group, isodiazonyl group, acryldinyl group, acrydonyl group, quinazolinedionyl group, quinoxalinedionyl group, benzoxadinedionyl group, benzoxadinonyl group and naphthalimidyl group.

As the substituent for Ar in the general formula (I), there can be mentioned the followings.

(1) Halogen atom, trifluoromethyl group, cyano group and nitro group.

(2) Alkyl group, preferably $(C_1 \sim C_{20})$, more preferably $(C_1 \sim C_{12})$ linear or branched alkyl group. The alkyl group may further contain a hydroxy group, cyano group, $(C_1 \sim C_{12})$ alkoxy group, phenyl group or a phenyl group substituted with halogen atom, $(C_1 \sim C_{12})$ alkyl group or $(C_1 \sim C_{18})$ alkoxy group.

(3) The alkoxy group $(-OR^1)$, wherein $R^1$ represents the alkyl group defined in the item (2) above.

(4) Aryloxy group, wherein the aryl group denotes a phenyl group or naphthyl group which may further contain $(C_1 \sim C_{12})$ alkoxy group, $(C_1 \sim C_{12})$ alkyl group or halogen atom as the substituent.

(5) Alkylthio group $(-OSR^1)$, wherein $R^1$ represents an alkyl group defined in the item (2) above.

wherein $R^2$ and $R^3$ represent independently a hydrogen atom, the alkyl group as defined in the item (2) above, an acyl group such as acetyl group or benzoyl group, or an aryl group. As the aryl group, there can be mentioned, for example, phenyl group, biphenyl group or naphthyl group which may further contain $(C_1 \sim C_{12})$ alkoxy group, $(C_1 \sim C_{12})$ alkyl group or halogen atom as the substituent. Further $R^2$ and $R^3$ may join together with a nitrogen atom to form a ring as a pyperidyl group or morpholyl group. Further, $R^2$ and $R^3$ may join with a carbon atom on an aryl group to form a ring as a urolidyl group.

(7) Alkoxycarbonyl group $(-COOR^4)$, wherein $R^4$ represents the alkyl group as defined in the item (2) above or the aryl group as defined in the item (4) above.

(8) Acyl group $(-COR^4)$, sulfonyl group $(-SO_2R^4)$, carbamoyl group or sulfamoyl group in which $R^2$, $R^3$ and $R^4$ represent the meanings the defined above, provided that $R^2$ and $R^3$ do not form a ring by joining with a carbon atom on the aryl group.

(9) Alkylenedioxy group such as methylenedioxy group or alkylene dithio group such as methylenedithio group.

As the substituent for the aryl group of $A^1$ and $A^2$, there can be exemplified the above-mentioned substituent groups (1)~(9).

Specific examples of the compounds represented by the general formula (I) used in the present invention will be shown below but the invention is not restricted only to them.

1

2

-continued

3

4

5

6

7

8

9

10

-continued

11

12

13

14

15

16

17

18

-continued

33

34

35

36

37

38

-continued

39

40

41

42

43

The electroluminescent device according to the present invention is constituted by forming an organic compound represented by the formula (I) into a thin film of less than 2 μm, preferably 0.05 to 0.5 μm in thickness as the entire organic compound layer(s), thereby forming an organic compound layer and sandwiching the formed layer between the anode and the cathode.

The present invention will now be described more specifically with reference to the drawings.

Figure 1:
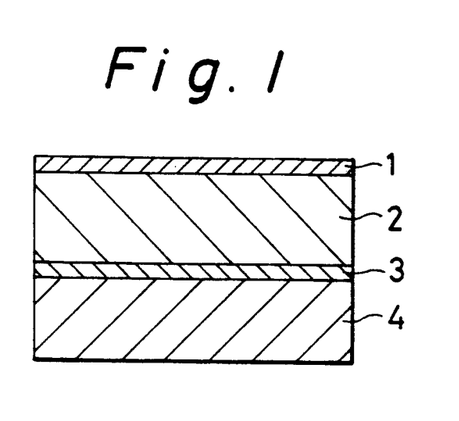
FIG. 1 through FIG. 3 are schematic cross sectional views for an electroluminescent device according to the present invention.

FIG. 1 is a typical example of an electroluminescent device according to the present invention, in which an anode, a luminescent layer and a cathode are successively formed on a substrate.

The electroluminescent device shown in FIG. 1 comprising an anode 3 disposed on a substrate 4 and a luminescent layer 2 interposed between the anode 3 and a cathode 1, is particularly useful in a case where the compound used has characteristics, that is, hole transporting property, electron transporting property and luminescent property by itself, or in a case where compounds each having one of the characteristics are used in admixture.

Figure 2:
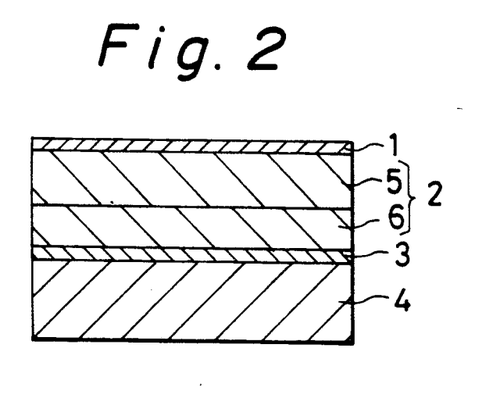

In the constitution shown in FIG. 2, a luminescent layer 2 is composed of the combination of a hole transporting compound layer 6 and an electron transporting compound layer 5. In this constitution, organic compounds having preferred characteristics can be combined, in which compound layers excellent in the hole transporting property or the electron transporting property are combined to each other for injecting smoothly holes or electrons from the electrodes, thereby displaying excellent luminescent characteristics. In this type of the electroluminescent device, since the luminescent substance is different depending on the organic compounds to be combined, it can not be defined generally which of the compounds emit light.

The preferable thickness of the electron transporting compound layer of the present invention is not more than 2000 Å. Also, the preferable thickness of the hole transporting compound layer of the present invention is not more than 2000 Å.

Figure 3:
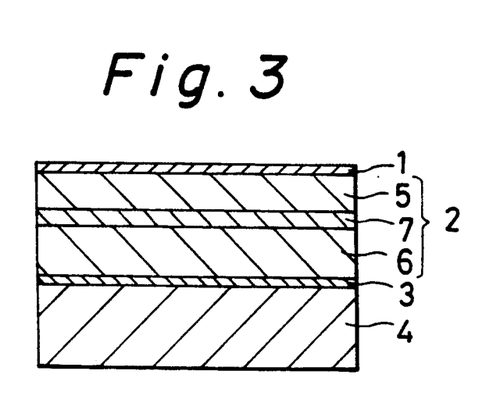

In the constitution shown in FIG. 3, a luminescent layer 2 is composed of the combination of a hole transporting compound layer 6, a luminescent compound layer 7 and an electron transporting compound layer 5, which may be considered as a type of further growing the concept of function separation described above.

The preferable thickness of the luminescent compound layer of the present invention is not more than 2000 Å.

Since this type of the electroluminescent device can be obtained by properly combining the compound layers adaptible to each of the characteristics of the hole transporting property, electron transporting property and luminescence property, the range from which the compounds are selected can be widened extremely, thereby facilitating easily the selection of the compound. In addition, since various compounds of different emission wavelength can be used, luminescent colors of the device can be varied.

Any of the compounds according to the present invention is excellent in the luminescence characteristics and it can be constructed to a structure as shown in FIGS. 1, 2 and 3.

Further, in the present invention, it is possible to provide both of the compounds excellent in the hole transporting property and the compounds excellent in the electron transporting property by properly selecting the kinds of $A^1$, $A^2$ or the substituents in the general formula (I).

Accordingly, in a case of the constitution shown in FIGS. 2 and 3, not less than two kinds of the compounds represented by the general formula (I) may be used as the luminescent layer-forming ingredient.

In the constitution shown in FIG. 3 according to the present invention, the compounds represented by the general formula (I) are used as the luminescent layer-forming ingredient, an aromatic tertiary amine or N,N'-diphenyl-N,N'-bis-(3-methylphenyl)-1,1'-biphenyl-4,4'-diamine may be used as the hole transporting compound, and aluminum trisoxine or perylene tetracarboxylic acid derivative may be used as the electron transporting compound.

The electroluminescent device in the present invention emits light under application of an electric bias to the luminescent layer, but it is preferable to use jointly a compound of excellent film-forming property in the formation of the luminescent layer, even a slight pinholes may cause short circuit, thereby functioning no more.

The luminescent layer is preferably formed by combining compounds with such excellent film-forming property, for example, polymer binders. As the polymer binder usable herein, there can be mentioned, for example, polystyrene, polyvinyl toluene, poly-n-vinyl carbazole, polymethyl methacrylate, polymethyl acrylate, polyester, polycarbonate and polyamide.

For improving the charge-injection efficiency from the electrode, the charge-injection transporting layer may be disposed separatedly between the electrodes.

As an anode material, there can be used, metals of a large work function such as nickel, gold, platinum, palladium and alloys thereof, and compounds thereof of a large work function such as tin oxide ($SnO_2$), tin indium oxide (ITO) and copper iodide, further, an electroconductive polymer such as poly(3-methylthiophene) and polypyrrole. The thickness of the anode is 100 to 5000 Å.

On the other hand, as a cathode material, metals of a small work function such as silver, tin, lead, magnesium, manganese, aluminum and the alloys thereof can be used. The thickness of the cathode is not less than 500 Å. It is preferably that at least one of the materials used for the anode and the cathode has a sufficient transparency in an emission wavelength region of a device. More specifically, it is preferred to have a light transmittance of not lower than 80%.

In the present invention, it is preferred to form the constitution as shown in FIG. 1 through FIG. 3 on a transparent anode disposed on a transparent substrate, but depending on the case, an opposite constitution may be used. Further, as the transparent substrate, glass, plastic film or the like may be used.

Further, in the present invention, a protection layer may be disposed or the entire device may be put into a cell and a silicone oil etc. may be sealed therein, for improving the stability of the thus obtained electroluminescent device, in particular, for the protection against the atmospheric moisture.

The electroluminescent device according to the present invention can provide luminescence at a high luminance of not lower than 15 cd/m², preferably, not lower than 25 cd/m² and, more preferably, not lower than 100 cd/m² of various colors such as green, green-blue, blue and purple-blue for a long period of time under a low driving voltage, for example, not greater than 35 V, preferably, not greater than 32 V.

In addition, since the device can be fabricated easily, for example, by vacuum vapor deposition, it can pro- vide a merit capable of efficiently producing a device of a large area at a low cost.

EXAMPLE

The present invention will now be explained more specifically referring to examples.

EXAMPLE 1

An anode made of tin-indium oxide (ITO) with a size of 3 mm × 3 mm and a thickness of 700 Å was formed on a glass substrate, over which a hole transporting layer composed of the compound No. 1 of a thickness of 750 Å, an electron transporting layer composed of an oxadiazole derivative represented by the formula (a) of a thickness of 750 Å and a cathode composed of aluminum of a thickness of 1000 Å were respectively formed by vacuum vapor deposition method to obtain a device as shown in FIG. 2. The vacuum degree was about $6 \times 10^{-6}$ Torr and the substrate temperature was a room temperature upon vacuum vapor deposition. A DC power source was connected by way of lead wires to the anode and the cathode of the thus prepared device. When a voltage of 23 V was applied, a current of 25 mA/cm$^2$ of a current density was flowed to the device and a clear luminescence of blue-purple color was observed over a long period of time. In this case, the luminance was about 270 cd/cm$^2$.

EXAMPLES 2~7

The same procedures as those in Example 1 were repeated except for using the compounds shown in Table 1 instead of the compound No. 1 used in Example 1, to obtain the results shown in Table 1.

EXAMPLE 8

A device as shown in FIG. 2 was made in the same procedures as those in Example 1 except for using the Compound No. 11 as the electron transporting layer-forming ingredient and using the diamine derivative represented by the following general formula (b) for the hole transporting layer-forming ingredient and sandwiching them between the anode and the cathode. When the device was driven in the same manner as in Example 1, a current of 96 mA/cm$^2$ of a current density was flowed to the device under a voltage of 31 V, and clear blue luminescence was observed for a long period of time. The luminance was about 15 cd/m$^2$.

TABLE 1

| | Example No. | | | | | | | |
|---|---|---|---|---|---|---|---|---|
| | 1 | 2 | 3 | 4 | 5 | 6 | 7 | 8 |
| | Compound No. | | | | | | | |
| | 1 | 4 | 8 | 15 | 33 | 17 | 24 | 11 |
| Voltage applied | 23 V | 21 V | 16 V | 24 V | 28 V | 22 V | 27 V | 31 V |
| Current density | 25 mA/cm$^2$ | 29 mA/cm$^2$ | 27 mA/cm$^2$ | 2.9 mA/cm$^2$ | 102 mA/cm$^2$ | 52 mA/cm$^2$ | 65 mA/cm$^2$ | 96 mA/cm$^2$ |
| Luminescent color | blue-purple | blue | green | blue | green | green-blue | blue | blue |
| Luminance | 270 cd/m$^2$ | 530 cd/m$^2$ | 1180 cd/m$^2$ | 25 cd/m$^2$ | 570 cd/m$^2$ | 200 cd/m$^2$ | 130 cd/m$^2$ | 15 cd/m$^2$ |

What is claimed is:

1. An electroluminescent device comprising a anode and a cathode and at least one organic compound layer sandwiched therebetween, at least one organic compound layer being composed of an organic compound of the general formula (I):

$$Ar-\left(N\begin{matrix}A^1\\A^2\end{matrix}\right)_n \quad (I)$$

wherein $A^1$ and $A^2$ each represents:
(a) an alkyl group;
(b) an alkyl group substituted with a hydroxy group, cyano group, (C$_1$-C$_{10}$) alkoxy group, phenyl group, halogen atom, or phenyl group substituted with (C$_1$-C$_{12}$) alkyl group or (C$_1$-C$_{12}$) alkoxy group;
(c) an aryl group; or
(d) an aryl group substituted with a halogen atom, trifluoromethyl group, cyano group, nitro group, a substituted or unsubstituted (C$_1$-C$_{20}$) alkyl group, a substituted or unsubstituted (C$_1$-C$_{20}$) alkoxy group, a substituted or unsubstituted (C$_1$-C$_{20}$) alkylthio group, a substituted or unsubstituted aryloxy group;

wherein $R^2$ and $R^3$ represent independently a hydrogen atom, a substituted or unsubstituted ($C_1$-$C_{20}$) alkyl group, an aryl group or an acyl group, or join together with a carbon atom on an aryl group or nitrogen atom; a —$COOR^4$ group wherein $R^4$ represents a substituted or unsubstituted ($C_1$-$C_{20}$) alkyl group or a substituted or unsubstituted aryl group, wherein $R^2$, $R^3$ and $R^4$ represent the same meaning defined-above, provided that $R^2$ and $R^3$ do not join with a carbon atom on the aryl group; or an alkylenedioxy group, and $A^1$ and $A^2$ may be identical to or difference from each other;
Ar represents a substituted or unsubstituted pyrenyl group;
and n represents 1 or 2.

2. An electroluminescent device according to claim 1, wherein n in the general formula (I) is 2.

3. An electroluminescent device according to claim 1, wherein at least one of $A^1$ and $A^2$ in the general formula (I) represents a substituted aryl group.

4. An electroluminescent device according to claim 3, wherein at least one of $A^1$ and $A^2$ in the general formula (I) represents an aryl group substituted with ($C_1$-$C_{20}$) alkyl or ($C_1$-$C_{20}$) alkoxy group.

5. An electroluminescent device according to claim 1, wherein the alkyl group of $A^1$ and $A^2$ in the general formula (I) is a linear or branched alkyl group having 1 to 20 carbon atoms.

6. An electroluminescent device according to claim 1, wherein the aryl group of $A^1$ and $A^2$ in the general formula (I) is monocyclic aromatic group, polycarbocyclic aromatic group, or heterocyclic aromatic group.

7. An electroluminescent device according to claim 1, wherein the substituent of the aryl group of $A^1$ and $A^2$, and the pyrenyl group of Ar in the general formula (I) is a halogen atom, trifluoromethyl group, cyano group, nitro group, a substituted or unsubstituted ($C_1$-$C_{20}$) alkyl group, a substituted or unsubstituted ($C_1$-$C_{20}$) alkoxy group, a substituted or unsubstituted aryloxy group, a substituted or unsubstituted ($C_1$-$C_{20}$) alkylthio group, wherein $R^2$ and $R^3$ represent independently hydrogen atom, a substituted or unsubstituted ($C_1$-$C_{20}$) alkyl group, acyl group or aryl group; or join together with carbon atom on aryl group or nitrogen atom, —$COOR^4$ wherein $R^4$ represents a substituted or unsubstituted ($C_1$-$C_{20}$) alkyl group, or a substituted or unsubstituted aryl group, —$COR^4$, —$SO_2R^4$, wherein $R^2$, $R^3$ and $R^4$ represent the same meanings defined-above, provided that $R^2$ and $R^3$ do not join with carbon atom on aryl group, or alkylenedioxy group.

8. An electroluminescent device according to claim 1, wherein the organic compound represented by the general formula (I) is selected from the group consisting of:

-continued

-continued

-continued

-continued and

* * * * *